(12) United States Patent
Hayes et al.

(10) Patent No.: US 7,079,113 B1
(45) Date of Patent: Jul. 18, 2006

(54) CONSUMER ELECTRONIC NAVIGATION SYSTEM AND METHODS RELATED THERETO

(75) Inventors: Patrick H. Hayes, Mission Viejo, CA (US); John E. Hyatt, Palos Park, IL (US)

(73) Assignee: Universal Electronics Inc., Cypress, CA (US)

( * ) Notice: Subject to any disclaimer, the term of this patent is extended or adjusted under 35 U.S.C. 154(b) by 500 days.

(21) Appl. No.: 09/611,620

(22) Filed: Jul. 6, 2000

(51) Int. Cl.
*G09G 5/00* (2006.01)
(52) U.S. Cl. ...................................... 345/158; 169/172
(58) Field of Classification Search ................. 345/158, 345/159, 160, 169, 170, 157, 172; 348/734
See application file for complete search history.

(56) References Cited

U.S. PATENT DOCUMENTS

| | | | |
|---|---|---|---|
| 5,255,313 A | 10/1993 | Darbee | |
| 5,414,426 A | 5/1995 | O'Donnell et al. | |
| 5,515,052 A | 5/1996 | Darbee | |
| 5,771,334 A | 6/1998 | Yamauchi et al. | |
| 5,831,946 A | 11/1998 | De Bie | |
| 5,946,447 A | 8/1999 | Nakagawa et al. | |
| 5,949,953 A | 9/1999 | Shirakawa et al. | |
| 5,959,751 A | 9/1999 | Darbee et al. | |
| 5,963,704 A | 10/1999 | Mimura et al. | |
| 5,991,260 A | 11/1999 | Kano et al. | |
| 5,995,161 A | 11/1999 | Gadre et al. | |
| 5,995,709 A | 11/1999 | Tsuge | |
| 6,014,183 A | 1/2000 | Hoang | |
| 6,040,829 A * | 3/2000 | Croy et al. | 345/817 |
| 6,055,478 A * | 4/2000 | Heron | 701/213 |
| 6,064,796 A * | 5/2000 | Nakamura et al. | 386/131 |
| 6,289,165 B1 * | 9/2001 | Abecassis | 386/46 |

FOREIGN PATENT DOCUMENTS

| | | |
|---|---|---|
| EP | 1001425 A2 | 5/2000 |
| JP | 11328936 | 11/1999 |
| JP | 2000011614 | 1/2000 |

OTHER PUBLICATIONS

U.S. Appl. No. 09/418,091, filed Oct. 14, 1999, Young et al.
Jim Taylor, *DVD Demystified*, Chapter Four, pp. 140-154, McGraw-Hill 1998.

* cited by examiner

*Primary Examiner*—Patrick N. Edouard
*Assistant Examiner*—Jean Lesperance
(74) *Attorney, Agent, or Firm*—Gary R. Jarosik

(57) ABSTRACT

A remote control having an improved user interface. A remote control for navigating a menu system provided on a digital video disc (DVD) is disclosed. The remote control comprises memory for storing a sequence of navigation keystrokes and programming for subsequently executing the sequence, whereby material on the DVD is navigated. Remote controls having a display screen are also used to enhance the user interface. More general systems and methods related to consumer electronics are also disclosed.

24 Claims, 14 Drawing Sheets

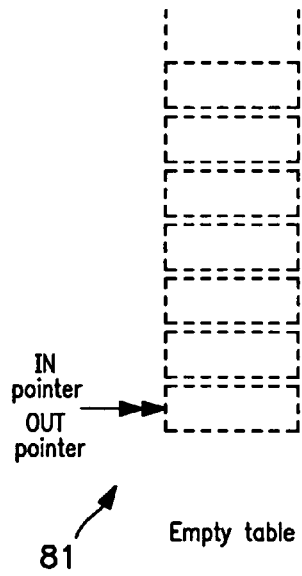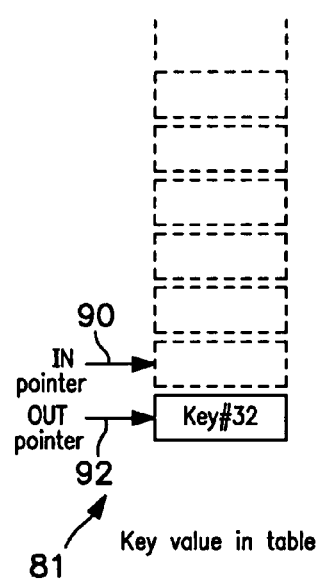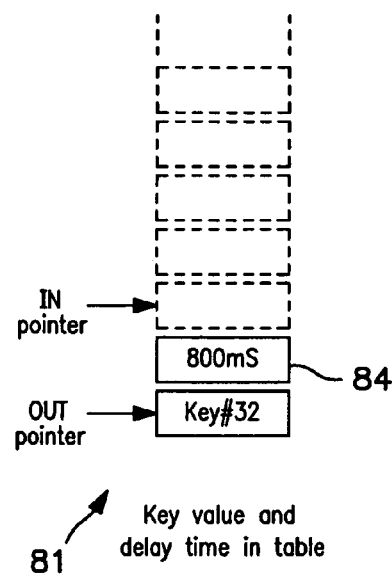
FIG. 8(a)  FIG. 8(b)  FIG. 8(c)
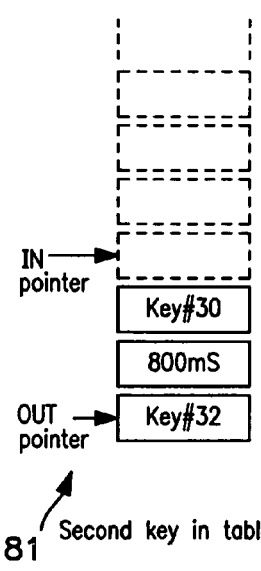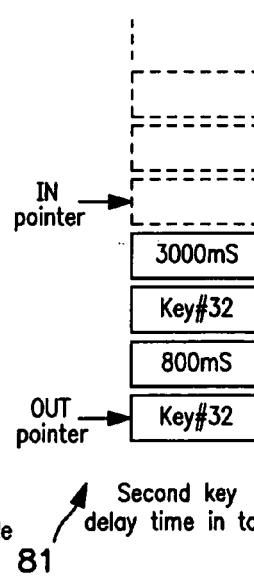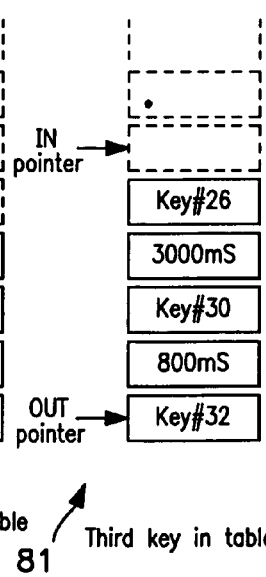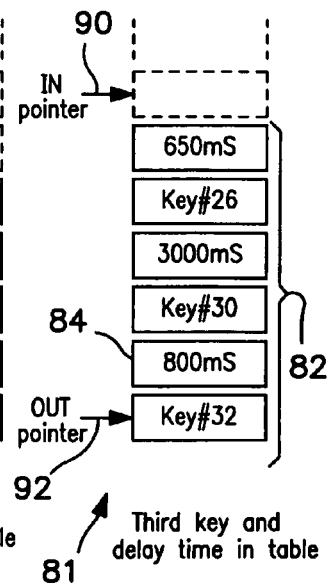
FIG. 8(d)  FIG. 8(e)  FIG. 8(f)  FIG. 8(g)

CONSUMER ELECTRONIC NAVIGATION SYSTEM AND METHODS RELATED THERETO

FIELD OF THE INVENTION

This patent relates to consumer electronics with particular embodiments featuring remote controls.

BACKGROUND OF THE INVENTION

Modern digitally encoded media such as digital video discs (DVDs) typically include additional interactive material over and above the basic video program or movie. Examples of this additional interactive material include "behind the scenes" footage, commentary, special effects and the like (i.e., secondary material). This additional material is accessed using a remote control to navigate a series of menu choices, either directly from within the main show (i.e., the primary material) or from an initial starting screen. In either case, however, the structure of the menu tree and the quantity and nature of the choices offered are defined by data on the removable media, and not on the playback hardware, i.e., the DVD player when discussing DVDs. Further, the format of the digital medium is predetermined and generally standard to be operable on a multitude of players by various manufacturers.

Accordingly, the sequence of remote control keystrokes required to access a "chapter" directly, to view additional information about a particular scene, to obtain a biography of a cast member, etc., varies from disc to disc though the format, such as the table of contents location on the disc may (or may not) be standard. In previous consumer electronic systems menu choices were largely predetermined by the playback hardware. This was satisfactory because most media did not have secondary material and thus, a fixed menu format was adequate. However, in the case of newer digitally encoded media, the keystrokes necessary to access any given feature or set of features will change from disc to disc (i.e., from removable digital media to removable digital media).

For example, in the currently specified DVD-video format, the content of a disk is made up of titles (each title being a major division of disk content such as a movie, feature, album, etc.) and chapters (parts of movies, songs, etc.). A typical movie DVD thus might include the movie itself, a theatrical trailer and actor biographies as three separate titles, with the long movie and the biographies further subdivided into chapters for direct access to particular sections. Almost all disks will include a main menu from which the desired title is selected. Each title can then also have a title menu, and if required, additional sub-menus. Each menu page display consists of a single-frame graphic (in fact, limited motion is possible in some areas) overlayed with up to 36 highlightable rectangular "buttons." These menus are navigated using four "arrow keys" and a "select" button on the remote control. The exact number, position, and function of the "buttons" on each page and the way in which the various menu pages are linked together is entirely under the control of the producer of the disc. The definition of each button includes four directional links to up to four other buttons on the screen corresponding to four arrow buttons on the remote control. Conventional remotes do not support more than four directions. This limits the links a disc producer can tie to any given mode. These links are not, however, required to correlate the physical layout of the buttons to a corresponding directional position displayed on screen—so complex networks of navigational relationships are possible. Also, while access to additional functions such as freeze, step, scan, camera angle select, etc., may be generically supported by the DVD player's remote control system, these features may be selectively enabled and disabled by the producer of the disc. (Note, for example, that many DVD movie discs will not allow the viewer to "fast forward" or skip past the opening FBI warning screen.) Therefore, it is no longer practical for a user to program frequently used operations onto a single key in the form of fixed sequences of commands (e.g., so called "macro" functions as described in U.S. Pat. No. 5,959,751, incorporated herein by reference, and others). Other patents and applications of interest, which are particularly relevant to remote control technology and are incorporated herein by reference, include U.S. Pat. Nos. 5,515,052; 5,414,426; 5,255,313; and U.S. patent application Ser. No. 09/418,091 filed Oct. 14, 1999.

Pat. '052 discloses a universal remote control with function synthesis. The remote control comprises driver circuitry for communicating code signal generation sequences including a code generated command signal followed by a code setting signal; and memory for storing information therein. Pat. '426 discloses a favorite key macro command and chained macro command in a remote control. The remote control comprises an entry/definition program and memory for enabling a user of the remote control to define a macro for selecting at least one favorite channel by entry of a series of keystrokes on the keyboard. The remote also includes a playback program in memory for enabling an operator to affect rapid selection of at least one favorite channel of the consumer electronic device to be controlled upon subsequent depression of the macro key. Pat. '313 discloses a universal remote control system having a signal generator to transmit signals which will cause specific functions to occur in specific controlled devices. Pat. App. Ser. No. '091 also discloses means and methods for operating a remote control.

The present invention improves on device, channel and menu control, and navigation associated with the prior art.

SUMMARY OF THE INVENTION

Most users of playback hardware are familiar with a function known as "previous channel" key which, when viewing a television (TV) provides, for example, a means for a direct return to the channel number last viewed. It would thus be advantageous if it were possible to offer a similar feature which allowed the user to return to the last point visited in a menu tree via minimal keystrokes, and preferably with a single keypress. This could be achieved if, for example, the remote control stored the last sequence of menu navigation keystrokes used and was capable of playing these keystrokes back at the press or activation of a single button. (For convenience, this "single key" will generally be referred to as the "JUMP" key throughout the rest of this document, although clearly other labels may be used for this key and function as well.)

Since a user might choose to interleave other operations (e.g., volume adjustments) between navigation keystrokes, the user interface (preferably incorporated in a remote control) preferably identifies and stores only those key operations related to the, e.g., DVD, menu navigation. All other keystrokes (including non-navigational and menu navigation keystrokes directed towards other devices) are discarded, or filtered. This filtering could also occur anytime prior to when transmission of the unwanted signal would occur. The remote control should, in preferred embodiments, also accurately identify the start and end point of each sequence performed to reproduce only the series of commands corresponding to the last menu operation performed.

Accordingly, the present invention provides a consumer electronic system comprising a consumer electronic device; a removable digital medium; and a control module. The consumer electronic device may generally comprise any appliance, but is preferably a media device, and, in particular, a digital media player. The removable digital medium, which is operable with the consumer electronic device, has a menu system stored thereon. Preferably the menu system includes a visual display graphically presenting selections, or options, etc. The control module has navigation keys for navigating the menu system when the digital medium is operating with the consumer electronic device. The control module acts as (or incorporates) a user interface and is preferably a hand held device. In preferred embodiments, the user interface is in a remote control. The control module further includes means for storing a sequence of navigation keystrokes of at least two of the navigation keys and means for repeating the sequence of navigation keystrokes with fewer keystrokes than the sequence contains. The digital medium is preferably, a digital video disc or a digital memory card, though other storage mediums will be apparent to those of skill in the art.

Another embodiment of the invention is directed toward a remote control operable with a consumer electronic device and a removable digital medium. The remote control comprises navigation keys; storage means for storing a sequence of navigation keys; and means for repeating the sequence.

Another embodiment of the invention is directed toward a remote control operable with a consumer electronic system having a consumer electronic device and a removable digital medium including a menu system. The remote control comprises a plurality of keys including navigation keys for navigating the menu system and a transmitter, preferably an IR transmitter, providing communications between at least one of the keys and the consumer electronic device. Means for storing a sequence of navigation keys and means for executing the sequence with less keystrokes than contained in the navigation keystrokes is also provided. The means for storing preferably includes programming and memory, though may also include circuitry. It will be understood that programming and circuitry are generally interchangeable, particularly with use of embedded microcontrollers. Therefore, "programming" and "circuitry" are often used interchangeably. The sequence is preferably stored in a sequence table in memory. The executing means, likewise, comprises programming and/or circuitry.

In accordance with the teachings of this invention, a method of navigating secondary material provided on a removable digital medium is provided. The secondary material may, for example, be additional interactive material over and above the basic video program or movie, e.g., in addition to the primary material. A sequence of navigation keys is stored and subsequently executed with fewer keystrokes than contained in the sequence. The secondary material is preferably navigated (subsequently, i.e., navigated again) upon operation of a single key.

Another embodiment of the invention is directed toward accessing material provided on a removable digital medium. A digital media player accesses the removable digital medium; and a control module controls the digital media player and has the capability of storing steps for accessing desired material provided on the removable digital medium. Preferably a user is allowed to store the steps for accessing the desired material. The control module preferably has the capability of accessing the desired material with a reduced step process, preferably a single key, subsequent to the step of storing steps for accessing the desired material. The user is thus allowed to access the desired material initially provided on the removable digital medium. The desired material may be accessed directly from the medium, from storage in the player or from other compatible components.

Another embodiment, also directed toward enhancing the user interface, includes a remote control having a display and means for defining keys (more generally images/graphics) on the display based upon information transmitted to the remote control. In one embodiment, the navigation keys are designed to operate with more than four links per node. In a preferred embodiment, a display screen is modified to match the number of navigation keys to the number of links per a given node. Further, in combination or in the alternative, command sequences may be generated based upon the information on the medium. The command sequences (e.g., navigation sequences) may be preprogrammed and stored on the medium for later transmission to the remote control or the remote control may have programming for generating sequences based upon, and customized to, information stored on the medium.

BRIEF DESCRIPTION OF THE DRAWINGS

FIGS. 8(a)–8(g) depict a key sequence table, similar to that shown in FIG. 5, changing as sequence values, including interkey values, are stored in the key sequence table.

DESCRIPTION OF EXEMPLARY EMBODIMENTS

Figure 1:
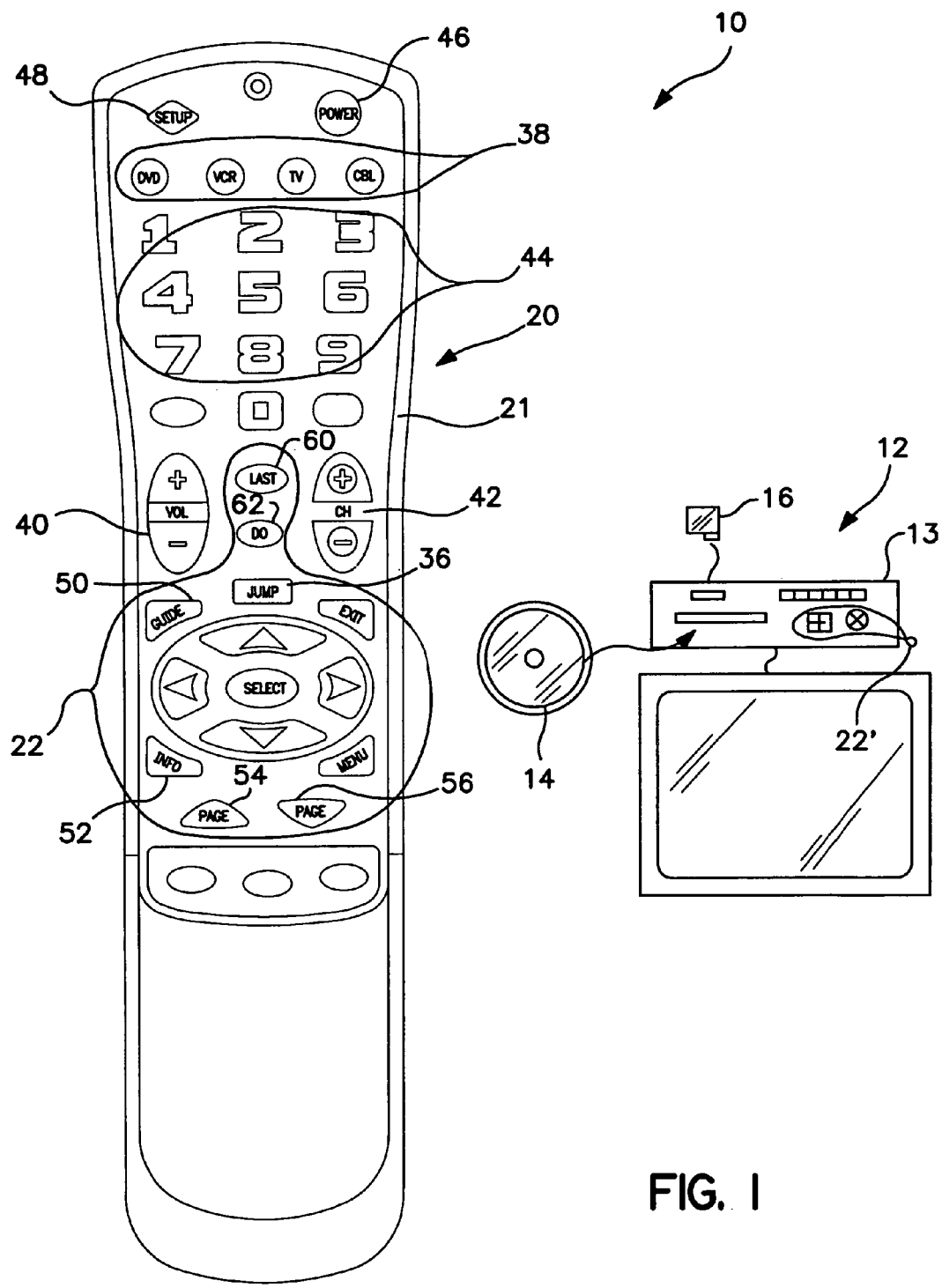
FIG. 1 depicts a consumer electronic system including a control module having navigation keys.

The present invention is discussed in relation to digital video discs (DVDs) and, in particular, to a remote control navigating material initially provided on a DVD, other uses will be apparent from the teachings disclosed herein. The present invention will be better understood from the following detailed description of exemplary embodiments with reference to the attached drawings, wherein like reference numerals and characters refer to like parts, and by reference to the following claims.

FIG. 1 shows an exemplary consumer electronic system 10 according to the present invention. The system 10 includes a consumer electronic device 12, which is a DVD player 13 in a preferred embodiment. Other devices operable with removable digital media are envisioned as being within the scope of the invention. Accordingly, the system preferably includes at least one removable digital medium. In the system 10 shown in FIG. 1 the consumer electronic device 12 is adapted to operate with a digital video disc 14 or a digital memory card 16.

The digital memory card may be a secure memory card such as may be obtained from Matsushita Electronic Industrial, also known as Panasonic, SanDisc, or Toshiba Corporation or other types known in the art. In one embodiment the secure digital memory card (SD memory card) is approximately 24 mm by 32 mm by 2.1 mm 9 pins. It has a capacity from 32 MB (megabytes) to 250 MB. Generally SD memory cards or memory sticks may be rated at different respective sizes, e.g., from 2 MB to 10 MB. Preferably, the SD card is SDMI (Secure Digital Music) compliant.

The system 10 also includes a control module 20 which in the preferred embodiment is a hand-held remote control 21. The remote control 21 includes navigation keys 22. In an alternative embodiment the navigation keys 22 may be integral navigation keys 22'. In FIG. 1 the integral navigation keys 22' are integral with the player 13.

Figure 2:
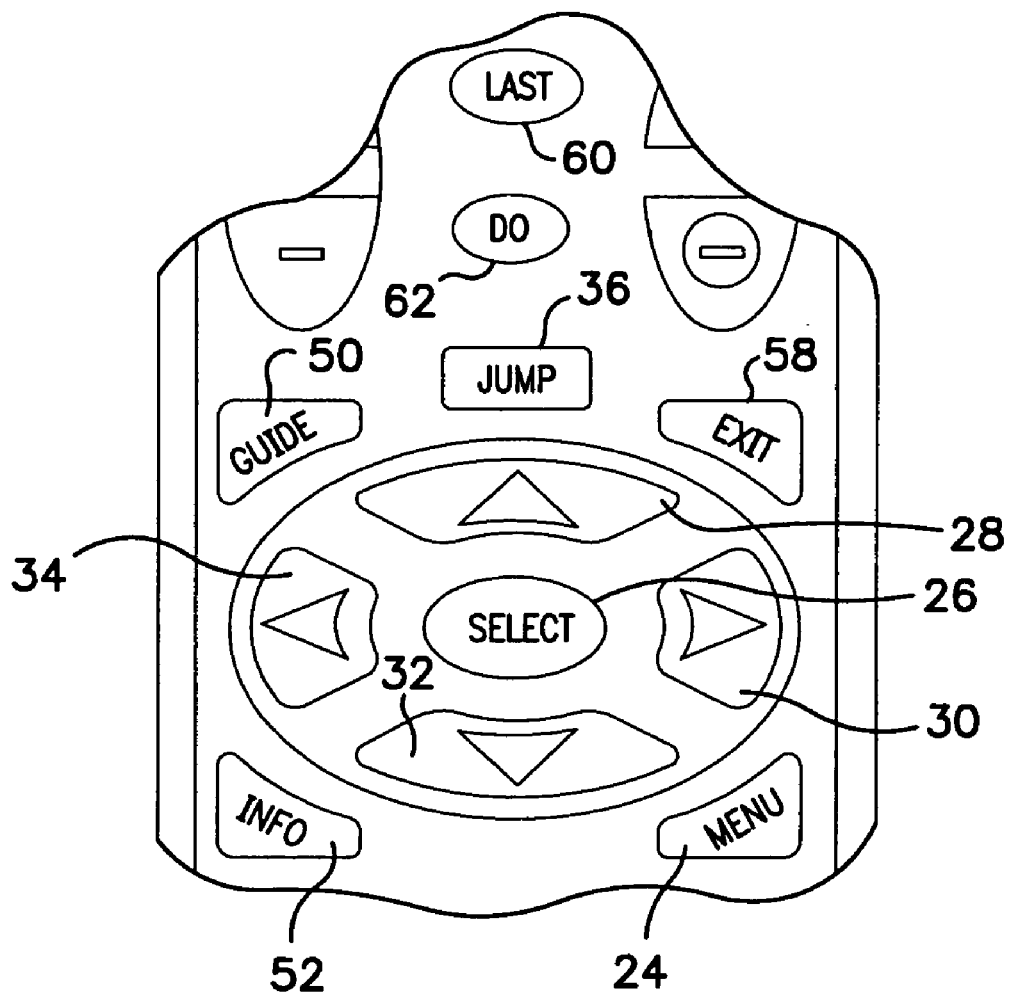
FIG. 2 depicts an enlargement of the navigation keys shown on the remote control of FIG. 1.

FIG. 2 shows an enlarged view of some of the navigation keys of remote control 21, including MENU key 24, SELECT key 26, and the four directional keys 28, 30, 32, and 34. FIG. 2 also shows the JUMP key 36.

The remote control 21, preferably includes mode keys 38 for allowing the remote control to change, in the embodiment shown in FIG. 1, between DVD, VCR, TV and cable modes. Remote control 21 generally includes standard keys such as volume key 40 and channel key 42. Digit keys 44 provide for direct entry and numeric response to queries which so require. The remote control 21 is also generally provided with a power key 46 and set up means, such as programming initiated with set up key 48.

It is desirable to provide the remote control 21 with additional navigation keys such as a GUIDE key 50, an INFO key 52, PAGE UP and PAGE DOWN keys 54, 56, and an EXIT key 58. Preferably the remote control 21 is provided with, so called "quick macro" keys "LAST" 60 and "DO" 62 which will be described in further detail below.

Figure 3:
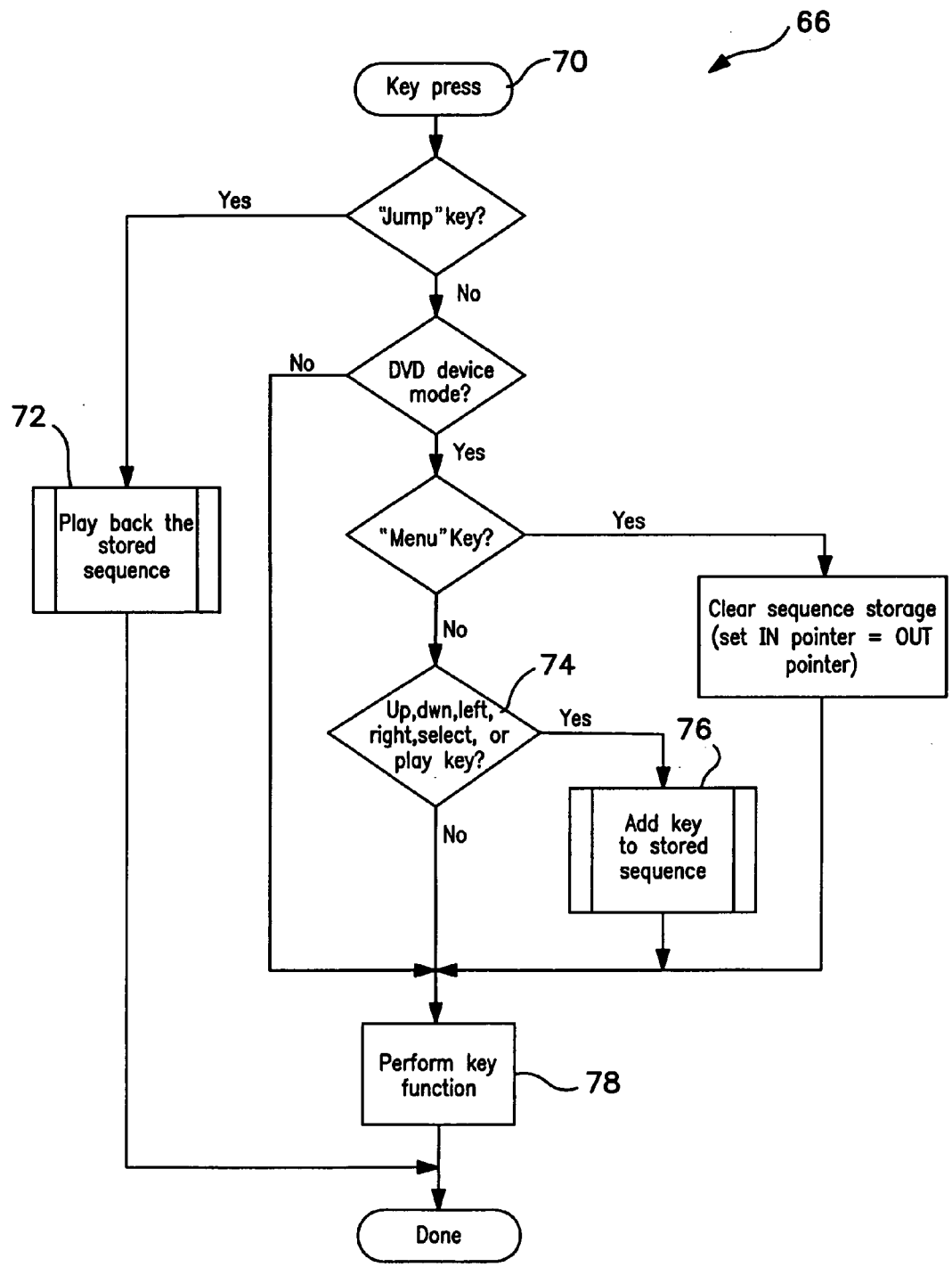
FIG. 3 shows a flowchart representing one method of storing and playing back a sequence of navigation keys.

FIG. 3 shows a flowchart 66 representing the basic logic, of one preferred embodiment, that may be carried out every time a key press of the remote control 21 is detected (step 70). Flowchart 68 of FIG. 4, which is discussed in more detail below, represents one method of storing a key's value.

In one embodiment, the remote control 21 checks to see if the key pressed is the JUMP key 36, i.e, remote control 21 monitors key activation. If the JUMP key is activated, the remote control 21 initiates (at step 72) playback of the currently stored sequence of the Menu navigation key presses. This will be described in more detail in conjunction with FIG. 6.

If the key activated is not the JUMP key, the remote control 21 then determines if its current mode setting is "DVD," for example. If not DVD mode, the user interface, e.g., the remote control 21, bypasses any further checking and performs the key function in the usual manner. This process ensures that only menu and navigation key presses applicable to control of the desired digital player device (i.e., the DVD player) are captured. (If the remote in question were a "single mode" or "modeless" unit, i.e. capable of controlling only the DVD player, for example, this step may easily be omitted.)

If the remote control 21 is in DVD mode, the remote 21 then checks to see if the activated key is the menu function (or MENU key) 24. If the MENU key 24 is pressed, one may assume this action to be the start of a new series (new sequence) of menu navigation keystrokes by the user. The sequence storage (e.g., sequence table 81) is then set to "empty" by setting the "IN" pointer 90 equal to the "OUT" pointer 92. Other methods of clearing the key sequence memory will be apparent. (The functioning and description of the IN and OUT pointers will be described in more detail in conjunction with FIGS. 4 and 5 below.) Note that in the process set forth in FIG. 3, the MENU key 24 is not stored in the sequence table 81. This is advantageous if MENU key 24 is always the start of a new navigation sequence. Thus, one need not use memory space to store the MENU key 24. In other implementations, there may be more than one key which initiates entry into a menu system (e.g., "GUIDE," "INFO" etc., used alone or in conjunction with a "MENU" button, and so forth) in which case the initiating key function should be stored as well for playback.

The remote 21 determines whether the key pressed is one of the set of functions associated with the menu navigation (up, down, left, right, select and play in this example) at step 74. If the key pressed is a navigation key, the remote 21 stores the key value into the sequence table 81 at step 76, if a navigation key was not pressed, the storage step is bypassed. This filtering means may occur when the values are being loaded into memory, or upon execution of the stored sequence. The storage process is discussed more fully below with reference to FIGS. 4 and 5.

In a preferred embodiment, the remote 21, at step 78, completes the processing and sends the transmitted, preferably IR, function corresponding to that pressed key. RF technology and or communication techniques are also compatible with the inventor.

Figure 4:
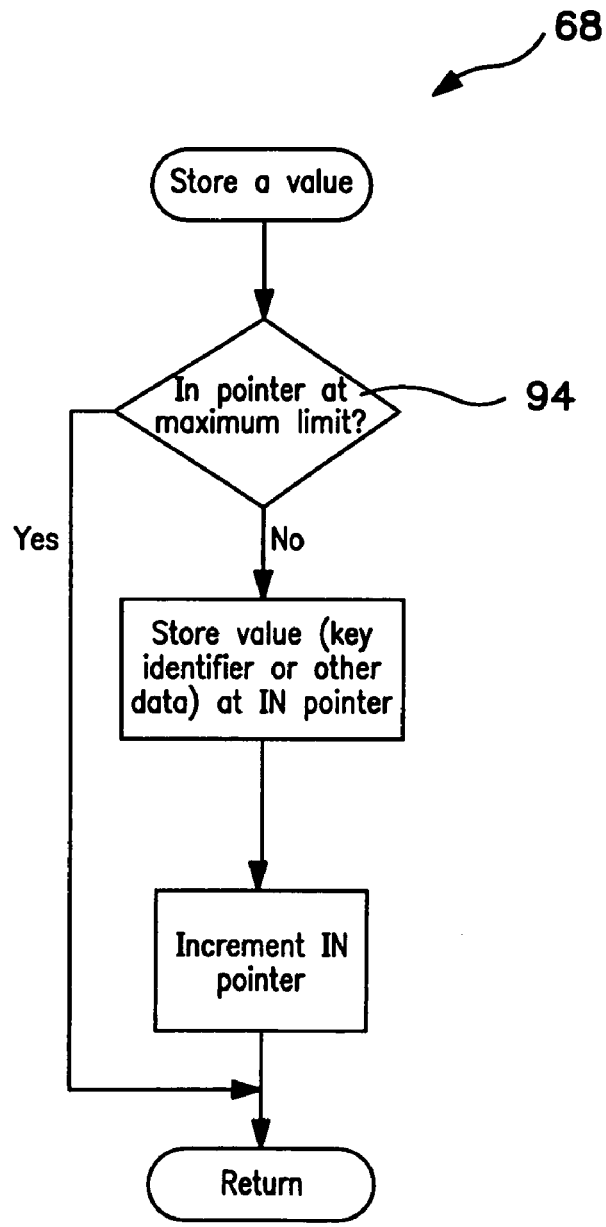
FIG. 4 shows a flow chart representing a method of adding a key to a stored sequence.
Figure 5A:
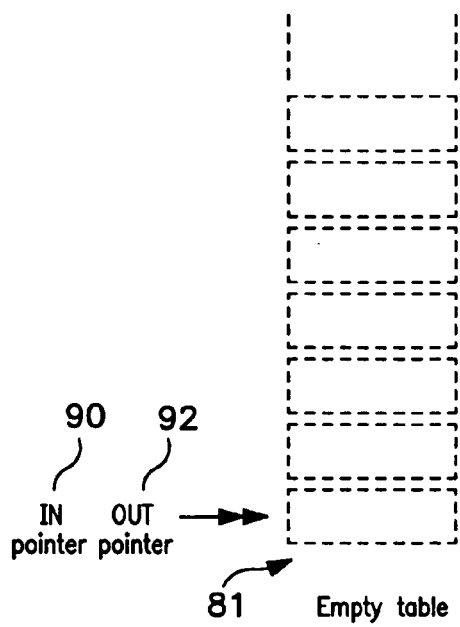
FIGS. 5(a)–5(d) show changes to a key sequence table as keys in a sequence are stored in the table.
Figure 5B:
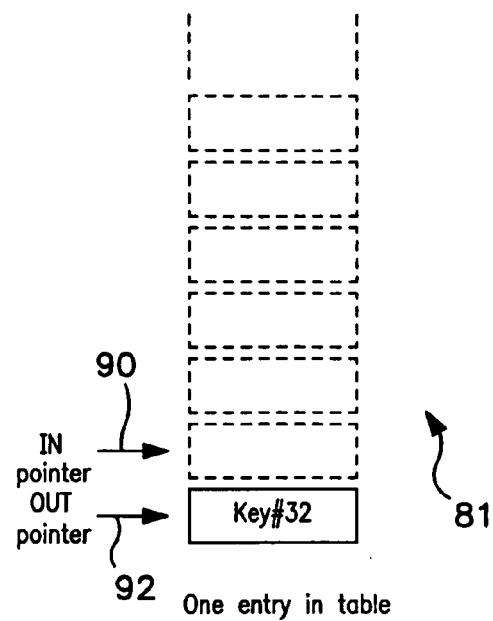
Figure 5C:
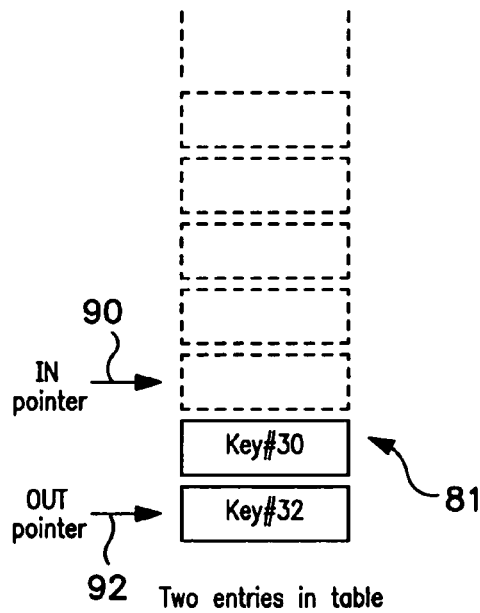
Figure 5D:
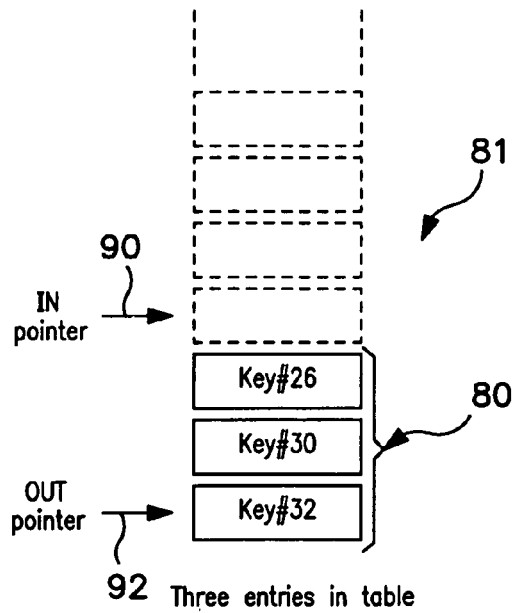

FIGS. 4 and 5 depict the process for saving a sequence of menu navigation keystrokes 80 (see FIG. 5d). FIG. 4 shows a flowchart 68 representing how data is entered into the sequence table 81 using the IN pointer. First the IN pointer 90 (see FIG. 5) at step 94 is checked against a maximum predetermined value. This is one method of preventing overflow of table data into areas of memory allocated to other remote control functions. Other methods safeguarding memory will be apparent to those of skill in the art. Without this safeguard, such an overflow could, for example, be created by a user idly jiggling one of the navigation keys while not actually using the DVD device. The maximum IN limit can be set to any value compatible with the aforementioned goal of memory protection. However, for practical purposes, a number on the order of 32 is expected to be more than adequate.

If the maximum IN value has not been reached, the remote 21 simply stores the current key value at the location indicated by the IN pointer 90 increments the IN pointer 90 to point to the next available location (see FIGS. 5(a)–5(d)) and returns to the main routine.

Referring to FIG. 5, one method of storing the navigation sequence is by controlling two pointers to a table space in memory, e.g., the sequence table 81. The pointers are labeled IN 90 and OUT 92. The IN pointer 90 indicates where the next keystroke to be stored will be placed, while the OUT pointer 92 indicates where playback of a key sequence will begin. During entry of data into the table 81, the OUT pointer 92 never changes. (Conversely, during retrieval of data from the table 81, the IN pointer 90 never changes.) Other methods of storage will be apparent to those of skill in the art from the teachings disclosed herein. FIGS. 5(*a*)–5(*d*) show the progression of table data contents and pointers as a sequence of keystrokes "DOWN ARROW," "RIGHT ARROW," and "SELECT" are stored.

Figure 6:
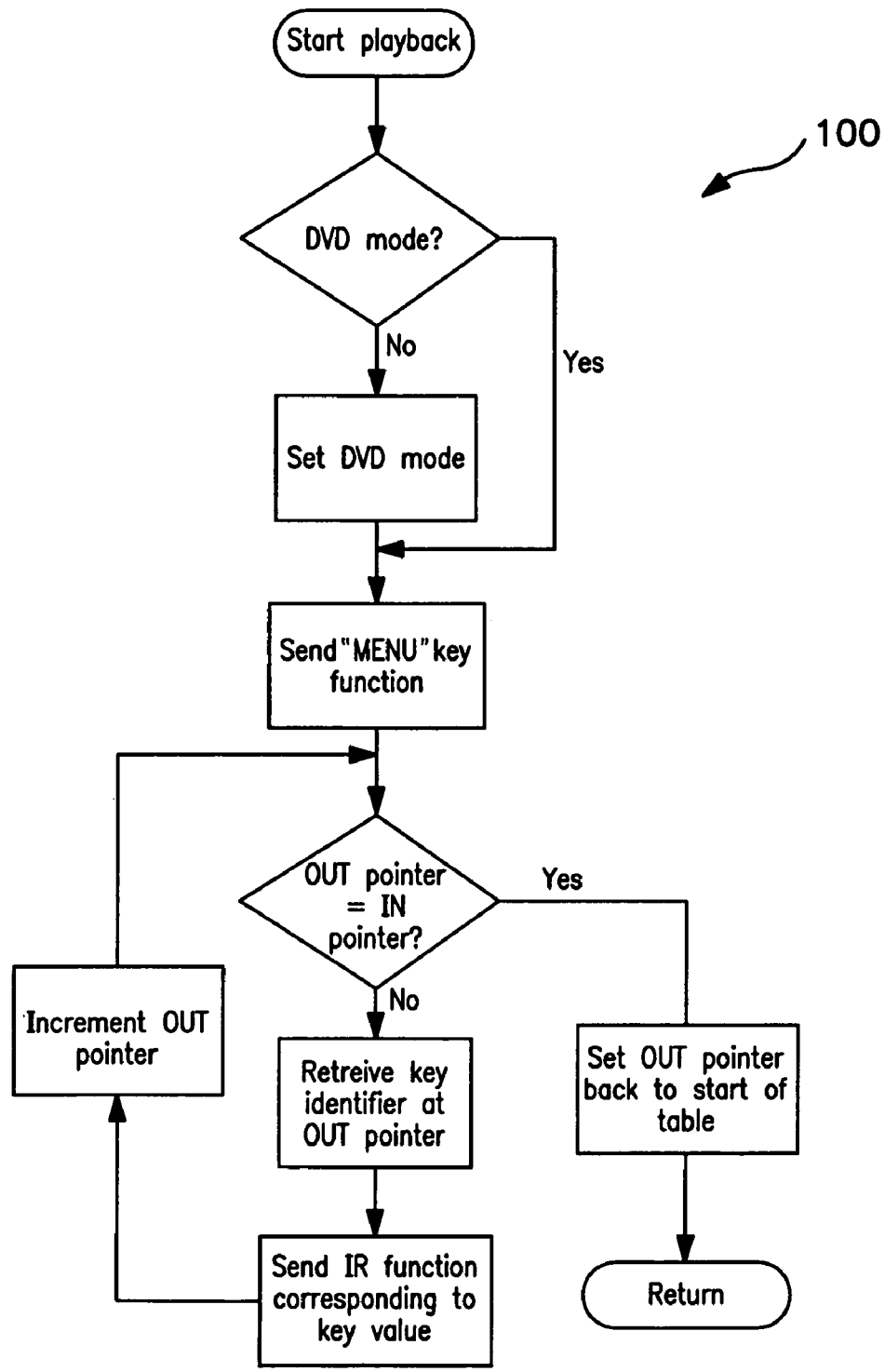
FIG. 6 shows a flowchart representing a process for playing back a stored sequence.

FIG. 6 shows a playback logic flowchart 100 representing a method to effect playback of the stored keystrokes 82 once the JUMP key 36 is activated. (More generally, a sequence may be stored between a first predetermined key and a second predetermined key, and playback initiated by a third predetermined key.) First the remote control 21 checks to see if it is currently in the applicable mode, e.g., DVD mode. If not, it switches to that mode (i.e., the JUMP key 36 effects control of the DVD device regardless of the current mode of the remote control 21.) In the playback implementation shown in flowchart 100, the remote control 21 automatically sends the implied "MENU" command (because the MENU command was not stored to save memory).

The logic then checks to see if the OUT pointer 92 equals the IN pointer 90. When the keystroke storage table (the sequence table) 81 is empty, the OUT pointer 92 equals the IN pointer 90. A sequence table 81 that is empty is shown in FIG. 5(*a*). If the OUT pointer 92 equals the IN pointer 90, the remote control 21 then preferable exits the DVD menu mode. Though the menu mode has been exited, the secondary material is still accessible. This is particularly so when, for example, the menu system was navigated to add an alternative viewing angle, or show special effects features, etc. along with play of the primary material.

In this embodiment pressing the JUMP key 36 when no key sequence has been stored is the equivalent of, or results in the same effect as, pressing the "MENU" key 24. That is the menu screen is displayed upon activation of JUMP key 36.

If the OUT pointer 92 does not match the IN pointer 90, the key data at the location corresponding to the OUT pointer 92 is retrieved, and then the corresponding IR command is transmitted. Programming then increments the OUT pointer value and repeats the OUT=IN? test. If OUT and IN are not equal, the control module continues to repeat the retrieve and transmit sequence until the OUT=IN? test is true. Alternative methods of changing and comparing pointer values is acceptable. More generally still, other methods of key storage and retrieval are acceptable and within the scope of the invention described herein.

When the two pointers are equal after the key sequence has been transmitted, the sequence playback is complete and the unit 21 resets the OUT pointer 92 back to its starting value (i.e., the unit 21 readies itself to play the same sequence back again if required) and then returns to the main routine. In this manner, one may navigate material, e.g., secondary material, to a desired screen. Intermediate screens may be displayed or the logic may allow the user to go directly to the desired screen.

Figure 7:
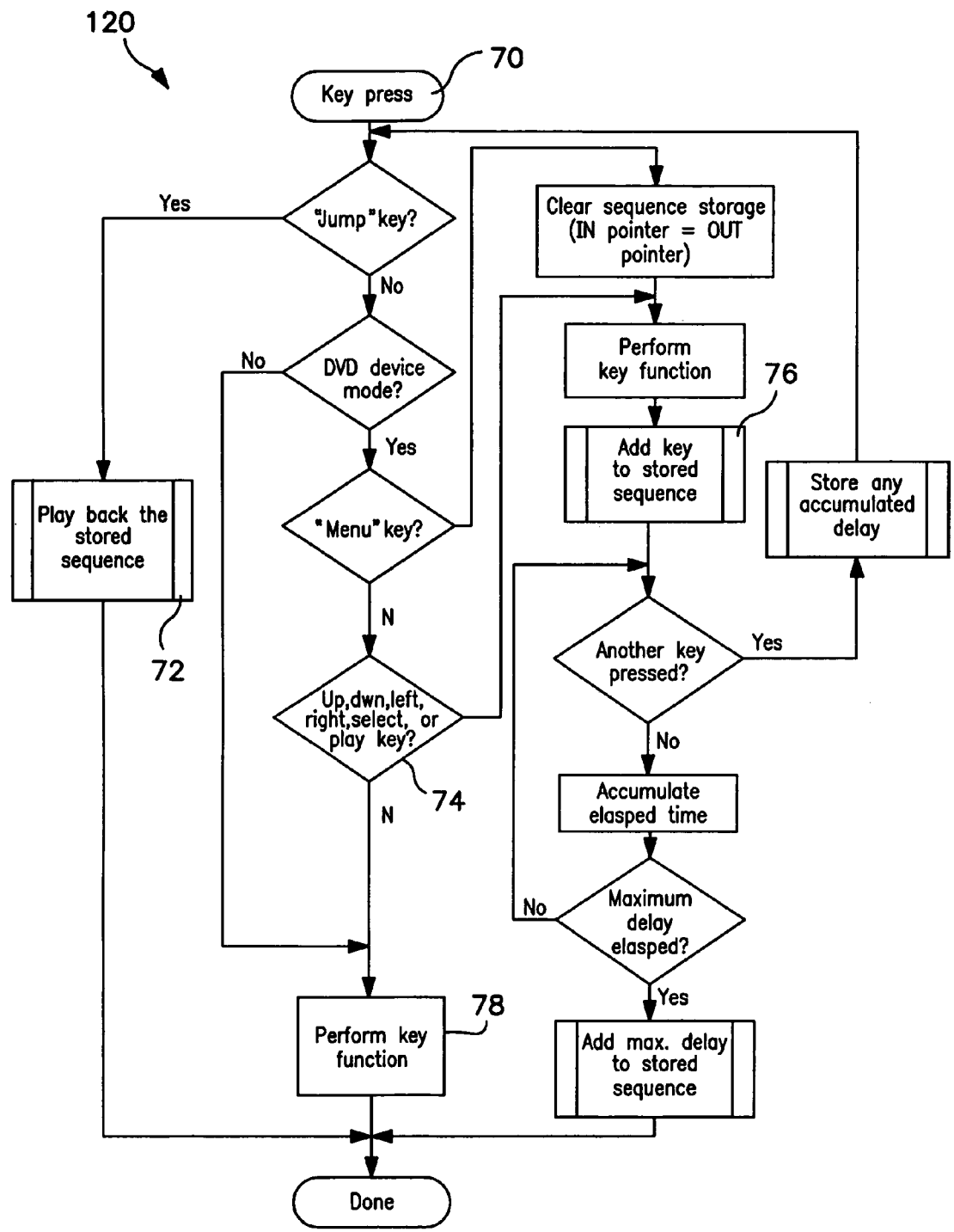
FIG. 7 shows a flowchart representing a process for storing and playing back a sequence that includes interkey time delays.
Figure 9:
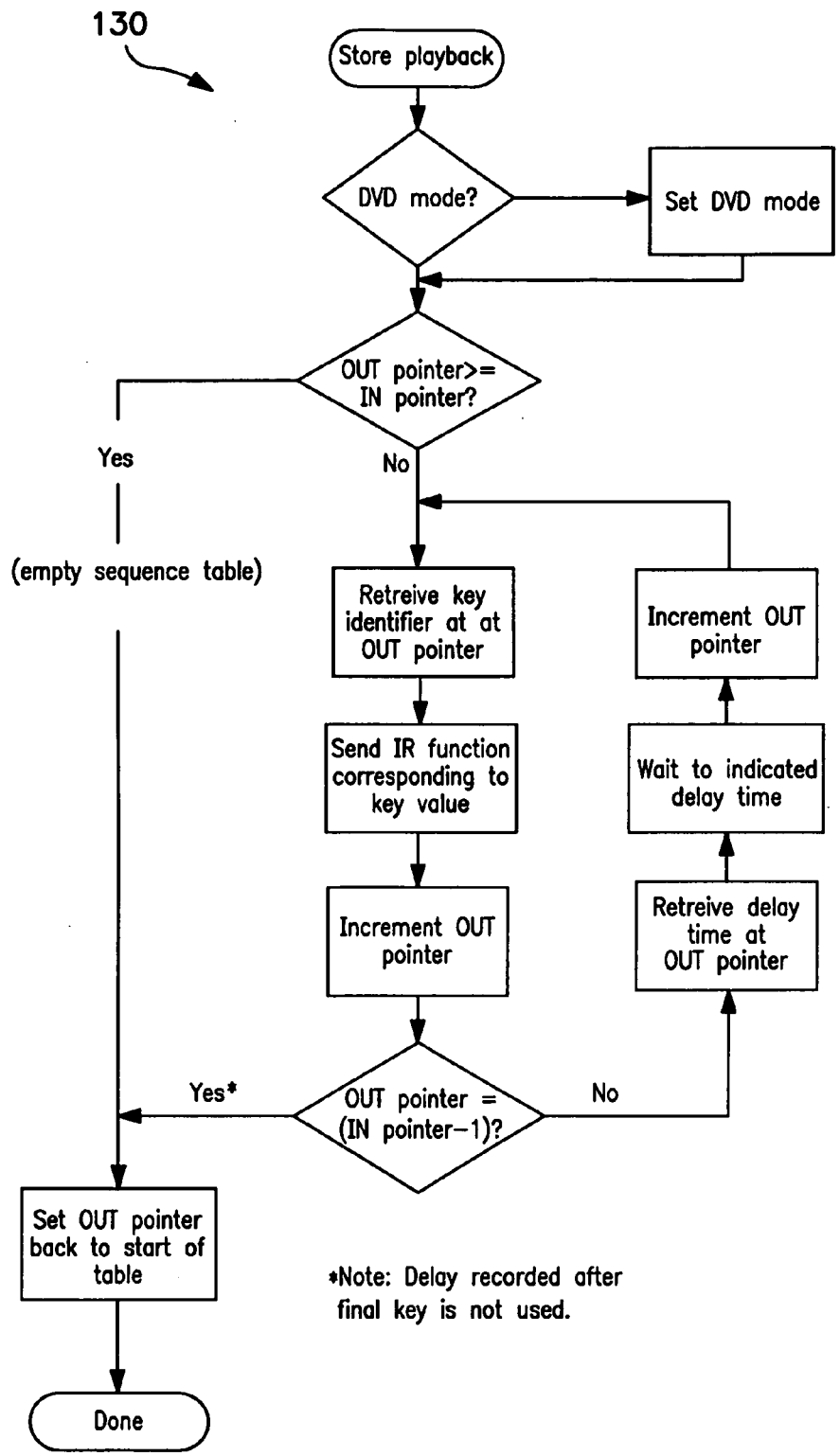
FIG. 9 shows a flowchart representing a process for playing back a stored sequence having interkey time delay values.

In some applications, it is anticipated that the time interval between key presses may be significant, i.e., relevant to the menu selection, etc. For example, where a key press causes a sub-menu display to be initiated, and the target device must wait to recognize a subsequent selection key press until the sub-menu display is ready. In these and other cases, it is advantageous to store not only key press values, but also the elapsed time between the key presses and then replicate these pauses during playback—i.e., a "real time" playback. FIGS. 7–9 show an alternative approach for storing and playing back key sequences. The methods discussed in reference to FIGS. 7–9 account for an interkey pause sequence 82 (see FIG. 8), or a sequence having an interkey pause time. For comparison and clarity, FIGS. 7–9 show how this feature can be implemented by modification of the routines shown in FIGS. 3–6.

FIG. 7 depicts a flowchart 120 representing a process for interkey delay storage. The flowchart 120 is modification of the routine shown in FIG. 3. Flowchart 120 is modified to include capture and storage of the interkey pause time 84 (see FIGS. 8(*c*) and 8(*g*)). The initial selection process (e.g., determining whether a key press is a DVD menu navigation key) and storage of the key press value remains similar. However, after transmitting the key function, the remote 21 remains active to measure the elapsed time between this keystroke and the next. When the next key press in a sequence is detected, or if a predetermined maximum time has elapsed (e.g., 5 seconds), the remote 21 times the value and stores it as a second entry into the sequence table 81 (see FIG. 8(*g*)).

FIG. 8 shows this time delay storage process in more detail regarding the sequence storage table 81. The same sequence of keystrokes in FIG. 5 is used. Playback of such a sequence of interleaved key values and delay times is shown in flowchart 130 of FIG. 9. Note that the delay time saved after the final key press need not be implemented.

The embodiments described above offers the user a convenient way to, among other features, repeat a sequence, preferably the last sequence, of keystrokes applicable to a particular sub-set of keys on a user interface. Features such as the "user macro" described in U.S. Pat. No. 5,959,751 allow the user to program often-used fixed sequences of keystrokes for controlling hardware, e.g., controlling the player vice accessing the storage medium, on a semi-permanent basis.

Another desirable feature would be a sequence definition process that falls somewhere between the "fully automatic," and filter capable, systems described in the above embodiments and the semi-permanent system described in U.S. Pat. '751. An objective is to allow the user to very quickly program and use a sequence of keystrokes of short-term usefulness, for example, for the duration of a show or sports event or portion of the video. This may be particularly useful in reviewing secondary material where one may want to see the same scenes multiple times from different angles, rather than watch the scenes simply play out. Further, this "DO" feature can be implemented as a sub set of the JUMP feature wherein the DO key sequence is not stored as part of the JUMP sequence.

Figure 10:
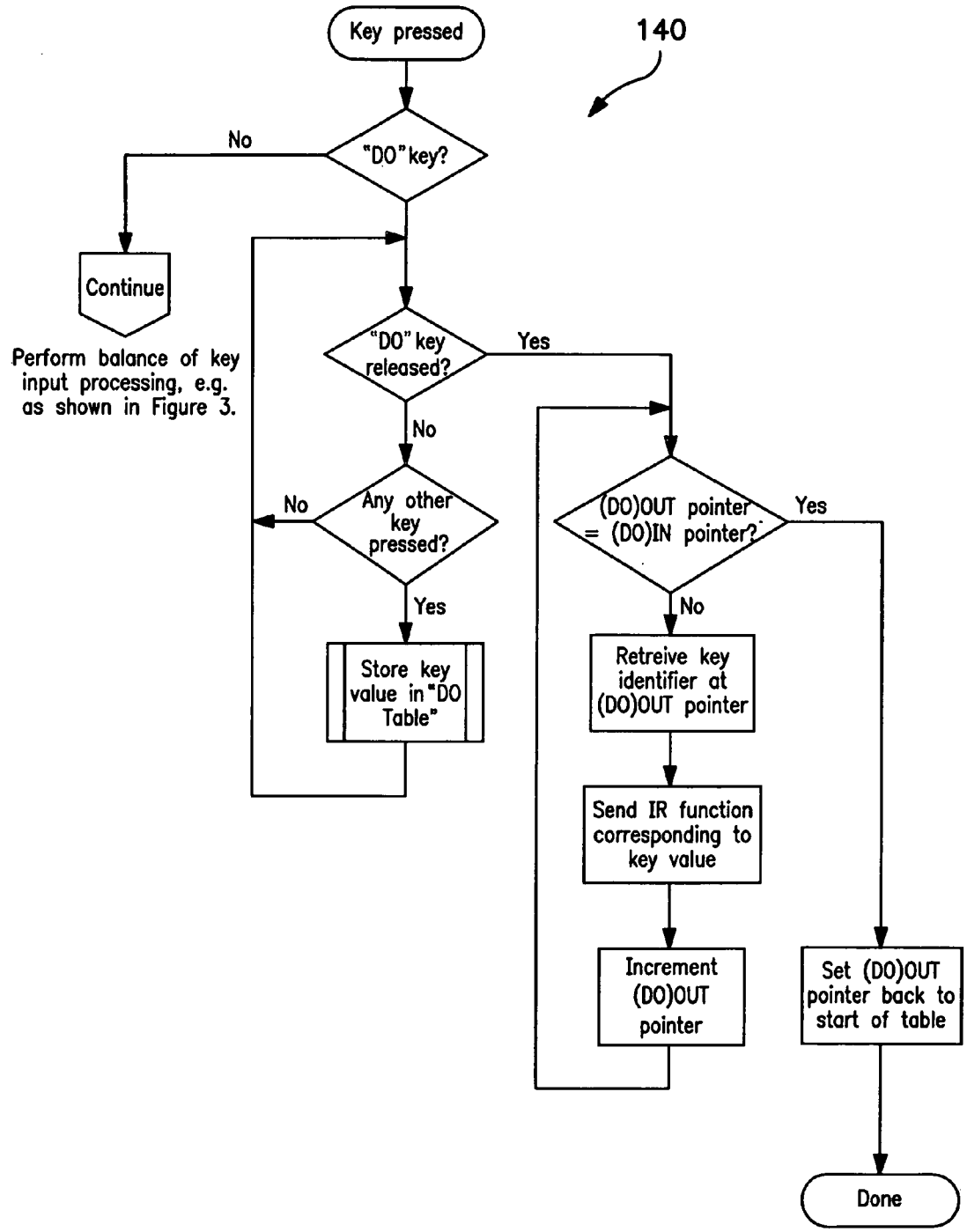
FIG. 10 shows a flowchart representing a process for implementing a so called quick macro.

One method of implementing a DO feature is represented by Flowchart 140 of FIG. 10 with the DO key, number 62 shown in FIG. 1. In general, if the user presses and holds this special, or predetermined key (DO key 62), the remote 21 will memorize all other keystrokes entered while DO is held down. If, however, the user presses and releases DO with no intervening input of other keys, the remote 21 will play back the last-entered DO sequence. Other variations on this exemplary process will be apparent from the teachings disclosed herein.

FIG. 10 shows Flowchart 140 setting forth an embodiment of the above-described process. When the DO key 62 is initially pressed, the remote 21 enters a state where it monitors the other keys on the unit, storing key values into a DO table for as long as the DO key remains depressed, i.e., adding keys to the DO sequence table. Storage of key values may be performed in exactly the same ways as previously described in conjunction with FIGS. 4 and 5, except, perhaps to a second storage location independent of any jump key sequence that may exist. This provides for both JUMP and DO features. (When the DO key 62 is released, the remote 21 will then play back the storage sequence of keystrokes.) In the implementation shown in FIG. 10, it may be noted that the key sequence entered is played back immediately after entry, by way of confirmation. It will be appreciated that minor changes in logic can be made to effect playback of the sequence only on subsequent presses of the DO key 62. Also, the capture of inter-key timings can be included if desired, in a manner similar to that described above in conjunction with FIGS. 7–9.

Figure 11:
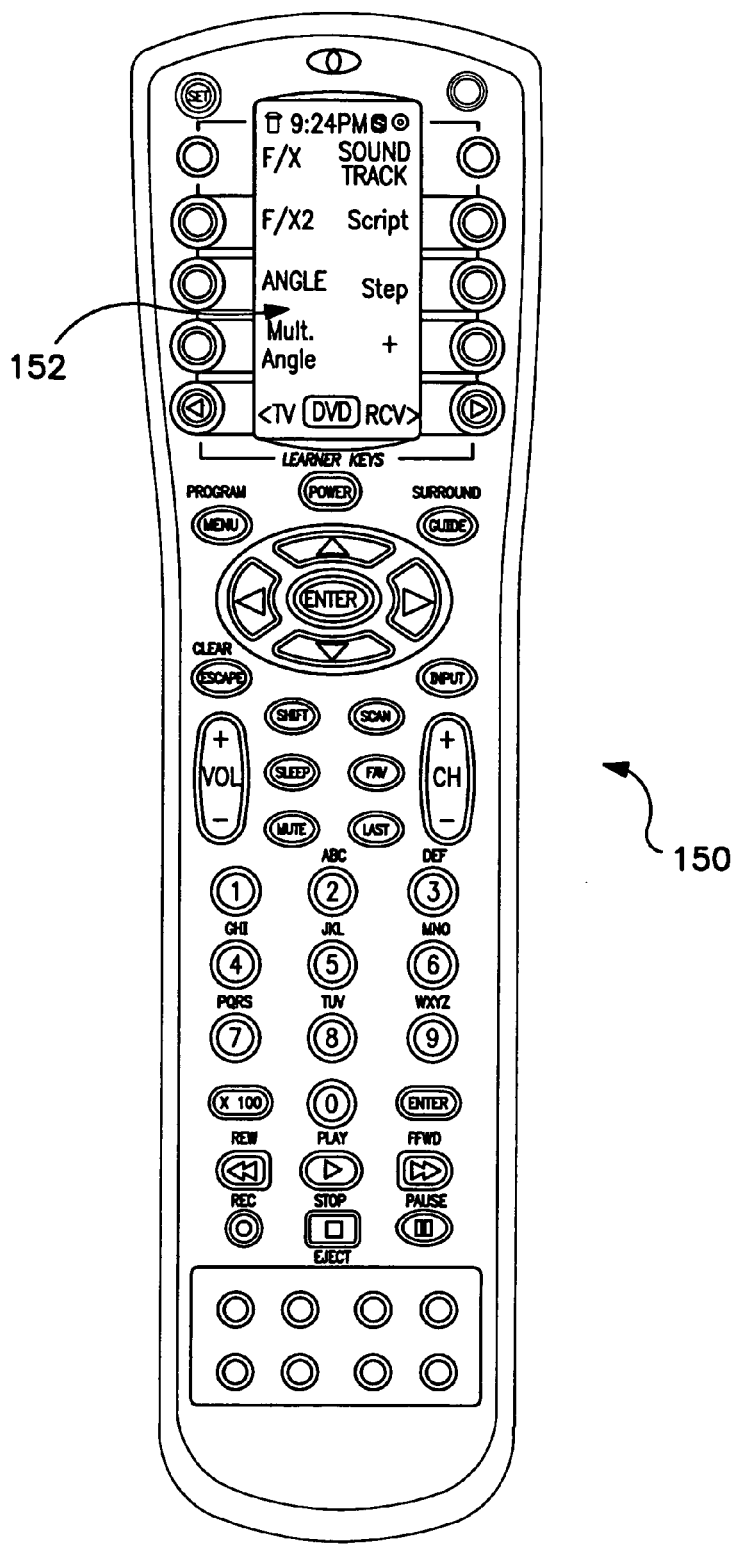
FIG. 11 shows a remote control capable of displaying at least one menu on a display screen.

In another embodiment, the user interface, e.g., a control module 20, reads at least one menu from the material provided on the removable digital medium 14 and stores the at least one menu in memory. In a preferred variation of this embodiment, the at least one menu is displayed on the control module 20. FIG. 11 shows a remote control 150 capable of displaying the at least one menu on a display screen 152. In a preferred embodiment, the display screen 152 is an LCD screen. The display screen 152, preferably via a touch screen, provides access to secondary material, such as special effects (F/X), different angle views (ANGLE), multiple angle views (Multi/Angle), and other such material as discussed previously.

In yet another embodiment, the remote control unit includes a larger LCD capable of displaying the menu graphic(s) and/or buttons as defined by the material provided on the removable digital medium and transmitted to the remote by the player hardware. If this LCD is also equipped with touch screen capability, the arrow keys may be dispensed with as the remote can automatically generate the appropriate sequence of navigation keystrokes followed by a "select" command in response to a single touch by the user on the desired choice. Alternatively, the remote can send just an "x-y" coordinate for the button touched and the player hardware can decode this to the appropriate function command.

Figure 12:
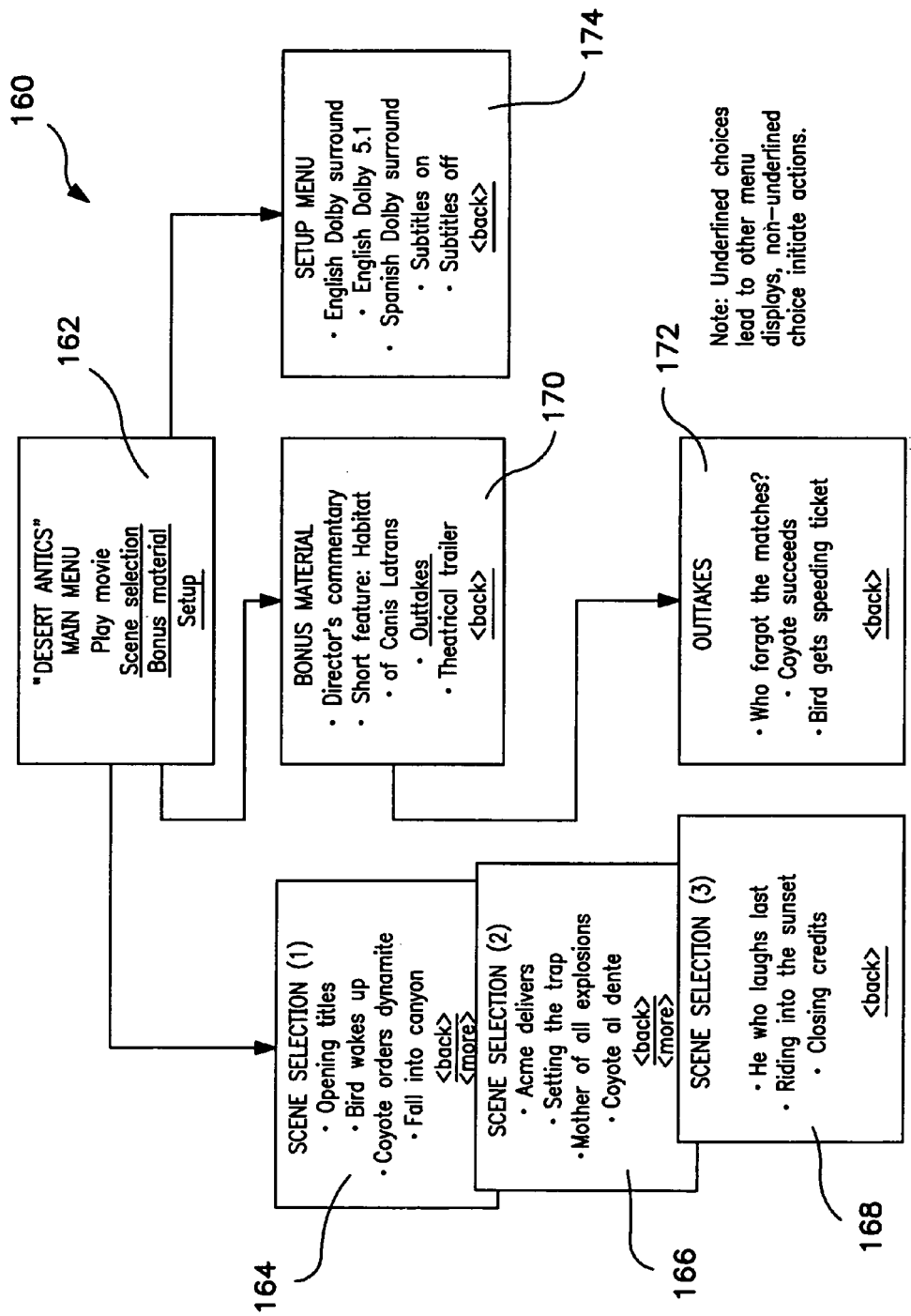
FIG. 12 shows an example of a DVD menu tree.

FIG. 12 depicts how a typical DVD menu tree 160 may be arranged in terms of the choices 162–174 offered the viewer. In a conventional system, these would be displayed on the TV screen and navigated using the directional keys on the remote control. However, an alternative approach on DVD players equipped to communicate with a two-way capable remote control including a touch screen LCD display might be to present the menu choices as a series of displays, e.g., 164–168, on the remote control itself. Selection is performed by the user touching the desired choice.

Figure 13:
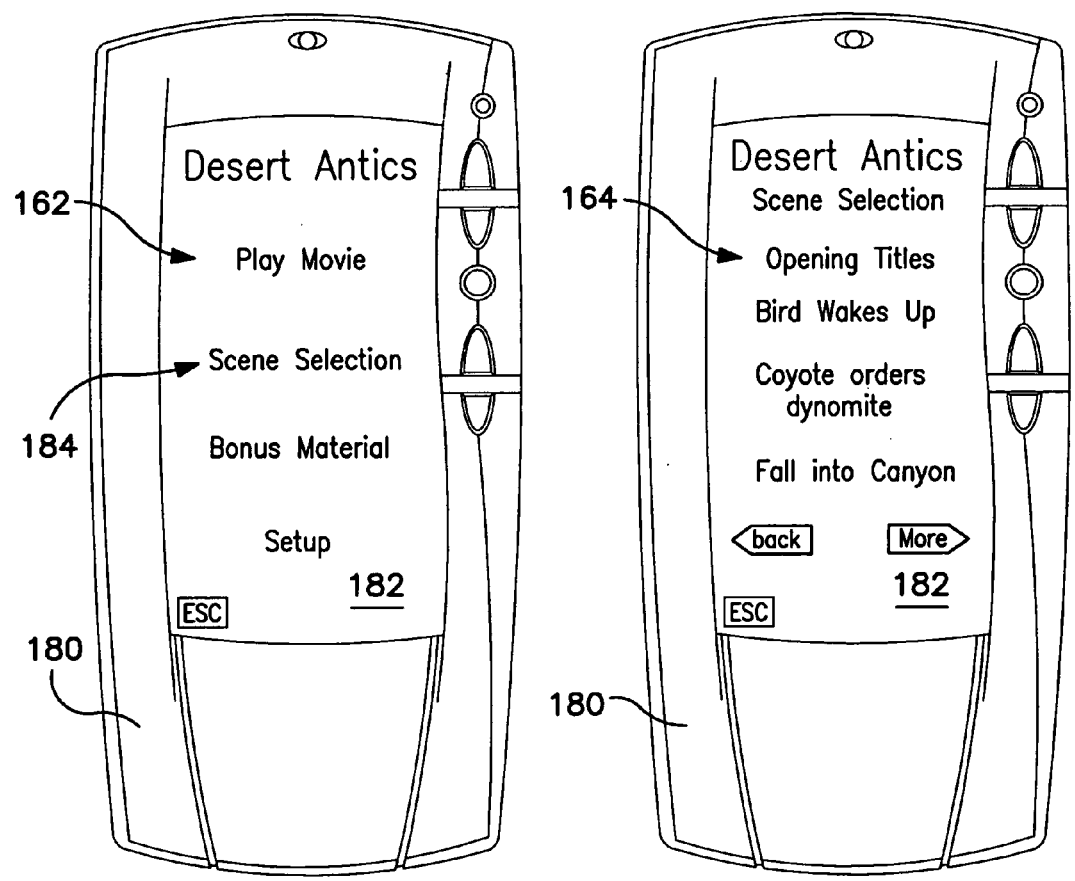
FIG. 13 shows a remote control displaying menu pages corresponding to pages of the tree depicted in FIG. 12.
Figure 14:
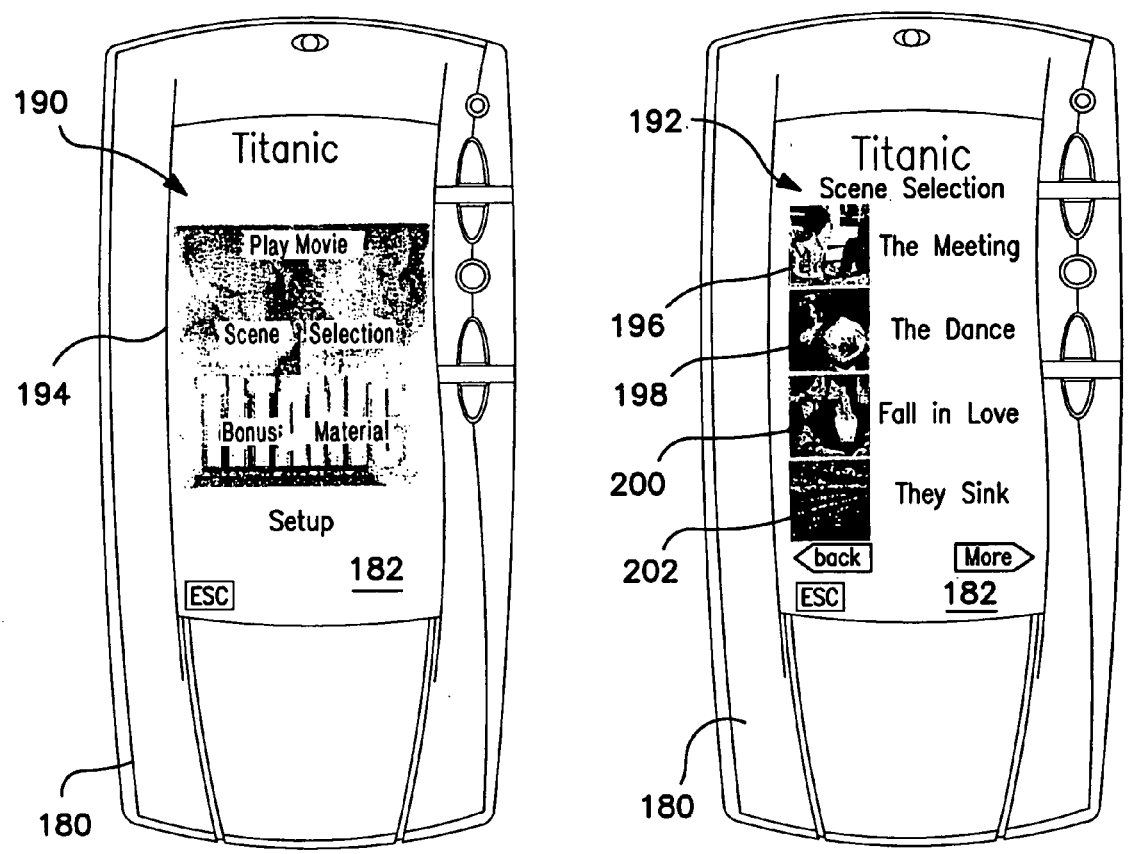
FIG. 14 shows a remote control having menus displaying graphics along with text.

FIGS. 13 and 14 show how such an application including a display menu may appear. FIG. 13 shows a remote control 180 having a touch screen display 182. The first two menu pages 162 and 164 of the tree 160 are shown in FIG. 12 as these might appear in a "text only" format. Text screen 164 may be obtained by touching heading 184 ("scene selection") on display 162. FIG. 14 shows portions 190 and 192 of a different menu tree which in this case includes black and white graphics 194–202 which are downloaded to the remote 180 to enhance the menu display appearance.

From the foregoing it will be apparent that a primary aspect of the invention is directed toward an improved remote control characterized in that the user interface is enhanced. In one embodiment, the enhancement is achieved by improving the navigation system. In one aspect, the navigation system is improved through use of means for accessing desired media in an expeditious manner. In another embodiment, the user interface is improved through an improved menu display. In a particular embodiment, the navigation system is enhanced through use of an improved display screen.

Accordingly, another aspect of the invention is directed toward means for achieving such user interface enhancements. In a particular embodiment, a microcontroller (a microprocess combined with memory) is proved with the interface enhancement means.

While the invention has been particularly shown and described with reference to particular embodiments thereof, it will be understood by those skilled in the art that various changes in form and detail may be made therein without departing from the spirit and scope of the invention.

The invention claimed is:

1. A remote control operable with a consumer electronic device, the remote control comprising:
   a plurality of keys including navigation keys that are activatable to transmit to the consumer electronic device command codes for commanding the consumer electronic device to navigate a menu of a digital media playable on the consumer electronic device;
   storage means for monitoring activations of the keys and for automatically storing a sequence of activations of the keys including the navigation keys during a process which also comprises the keys being activated to transmit to the consumer electronic device command codes to navigate the menu of the digital media; and
   means for repeating the stored sequence of activations of the keys to thereby cause a retransmission to the consumer electronic device of command codes corresponding to those activations of the keys that are within the stored sequence.

2. The remote control of claim 1, comprising means for removing activations of non-navigation keys from the stored sequence.

3. The remote control of claim 1, wherein the storage means comprises means for storing a time that elapses between activations of two keys within the sequence.

4. A remote control operable with a consumer electronic system having a consumer electronic device and a removable digital medium operable with the consumer electronic device, the medium including a menu system, the remote control comprising:
   a plurality of keys including navigation keys that are activatable to transmit to the consumer electronic device command codes for commanding the consumer electronic device to navigate the menu system;
   a transmitter providing communication with the consumer electronic device in response to activation of at least one of the keys;
   means for monitoring activations of the keys and for automatically storing a sequence of activations of the keys including the navigation keys during a process which also comprises the keys being activated to transmit to the consumer electronic device command codes to navigate the menu system; and
   means for executing at least a subset of the sequence of activations of the keys to thereby cause a retransmission to the consumer electronic device of command codes corresponding to those activations of the keys that are within the subset.

5. The remote control of claim 4, comprising means for removing activations of non-navigation keys from the stored sequence to create the subset of the sequence.

6. The remote control of claim 4, wherein the means for storing the sequence comprises means for storing a time that elapses between activations of two keys within the sequence.

7. The remote control of claim 4, wherein the means for executing a subset of the sequence is responsive to activation of a single key.

8. The remote control of claim 7, wherein the single key is predetermined.

9. In a remote control having a plurality of keys including navigation keys, a readable medium having instructions for navigating secondary material provided on a removeable digital medium playable on a consumer electronic device, the instructions performing steps comprising:

monitoring user activations of the keys for sensing a sequence of user activations of the keys including the navigation keys when used to transmit to the consumer electronic device command codes for commanding the consumer electronic device to navigate the secondary material of the digital medium;

automatically storing the sequence as part of a process which also comprises the keys being activated to transmit to the consumer electronic device command codes for commanding the consumer electronic device to navigate the secondary material of the digital medium; and allowing a user to execute at least a subset of the stored sequence of activations of the keys to thereby cause a retransmission to the consumer electronic device of command codes corresponding to those activations of the keys that are within the subset to command the consumer electronic device to navigate the secondary material of the digital medium.

10. The readable medium of claim 9, wherein the user activations of the keys commands the consumer electronic device to navigate the secondary material to a desired screen and executing the stored sequence commands the consumer electronic device to again navigate to the desired screen.

11. The readable medium of claim 10, wherein executing the stored sequence commands the consumer electronic device to display each screen that was displayed when the sequence of user activations was sensed.

12. The readable medium of claim 10, wherein executing the stored sequence commands the consumer electronic device to display the last screen that was displayed when the sequence of user activations was sensed.

13. The readable medium of claim 9, wherein the instructions further provide for commanding the consumer electronic device to display primary material provided on the removable medium.

14. The readable medium of claim 9, wherein the instructions further provide for controlling operation of the consumer electronic device.

15. The readable medium of claim 9, wherein the instructions further perform the step of removing the activation of non-navigation keys from the sequence to create the subset.

16. The readable medium of claim 9, wherein the instructions further perform the step of storing a time that elapses between activations of two keys within the sequence.

17. The readable medium of claim 9, wherein the instructions further perform the step of identifying the start and end points of the sequence.

18. The readable medium of claim 9, wherein activation of a single key allows a user to execute the stored sequence.

19. The readable medium of claim 9, wherein the instructions further perform the step of preventing memory overflow.

20. The readable medium of claim 9, wherein the remote control is operable with a digital video disc player and the instructions further perform the step of determining if the remote control is in a DVD mode.

21. The readable medium of claim 20, wherein the instructions further perform the step of placing the remote control in the DVD mode when executing the stored sequence.

22. The readable medium of claim 21, wherein activation of a single key allows a user to execute the stored sequence.

23. The readable medium of claim 9, wherein storing the sequence occurs in response to activating a predetermined key.

24. The readable medium of claim 23, wherein activation of the predetermined key also allows a user to execute the stored sequence.

* * * * *